United States Patent
Lin

(10) Patent No.: US 7,130,653 B2
(45) Date of Patent: Oct. 31, 2006

(54) POWER ALLOCATION OF WIRELESS TRANSMISSION APPARATUS

(75) Inventor: Ping-Chun Lin, Hsin-Chu (TW)

(73) Assignee: Mediatek Inc., Hsinchu (TW)

( * ) Notice: Subject to any disclaimer, the term of this patent is extended or adjusted under 35 U.S.C. 154(b) by 478 days.

(21) Appl. No.: 10/639,504

(22) Filed: Aug. 13, 2003

(65) Prior Publication Data

US 2004/0038701 A1 Feb. 26, 2004

(30) Foreign Application Priority Data

Aug. 22, 2002 (TW) ................................ 91118954 A

(51) Int. Cl.
*H04B 7/00* (2006.01)
*H04B 17/00* (2006.01)
*H04B 1/04* (2006.01)

(52) U.S. Cl. ................ 455/522; 455/67.11; 455/67.13; 455/127.1; 455/226.2; 455/522; 455/118; 455/63.1; 455/550.1; 455/95; 455/115.1; 455/115.3; 455/134; 455/136; 455/154.1; 455/161.3; 370/318

(58) Field of Classification Search ................ 455/118, 455/127.1, 522, 63.1, 67.11, 67.13, 550.1, 455/95, 115.1, 115.3, 134, 136, 154.1, 161.3, 455/226.2, 124

See application file for complete search history.

(56) References Cited

U.S. PATENT DOCUMENTS

| 5,159,283 A | | 10/1992 | Jensen ......................... 330/129 |
| 5,627,863 A | * | 5/1997 | Aslanis et al. .............. 375/357 |
| 5,697,073 A | | 12/1997 | Daniel et al. ................ 455/126 |
| 5,894,473 A | * | 4/1999 | Dent ........................... 370/342 |
| 5,901,180 A | * | 5/1999 | Aslanis et al. .............. 375/261 |
| 6,587,445 B1 | * | 7/2003 | Mimura ....................... 370/331 |
| 6,603,751 B1 | * | 8/2003 | Odenwalder ................ 370/331 |
| 2002/0093922 A1 | * | 7/2002 | Grilli et al. ................. 370/328 |

FOREIGN PATENT DOCUMENTS

EP 047135 A2 7/1990

* cited by examiner

*Primary Examiner*—Tony T. Nguyen
(74) *Attorney, Agent, or Firm*—Thomas, Kayden, Horstemeyer & Risley

(57) ABSTRACT

The present invention relates to a wireless transmission apparatus. The wireless transmission apparatus is used for transmitting a RF signal by a selected power allocation to meet the requirement of specific transmission standard. The wireless transmission apparatus comprises a memory, a processor and a power data converting module. The memory is used for storing a plurality of predetermined original power data profiles. Each original power data profile comprises a plurality of predetermined first original power ramp data and a corresponding power allocation for transmitting the RF signal. The processor is used for controlling the data flow. The power data converting module converts the data of original power data profile to a corresponding data of transmission power data profile. The power data converting module comprises an interpolation adjusting unit for adjusting and increasing the plurality of predetermined first original power ramp data within each original power data profile to a plurality of second transmission power ramp data with a predetermined interpolating method. The plurality of second transmission power ramp data are more than and comprise the plurality of first original power ramp data. The wireless transmission apparatus further comprises a power amplifier for transmitting the RF signal according to the power allocation defined by the plurality of second transmission power ramp data.

52 Claims, 4 Drawing Sheets

POWER ALLOCATION OF WIRELESS TRANSMISSION APPARATUS

BACKGROUND OF THE INVENTION

1. Field of the Invention

The present invention relates to a wireless transmission apparatus, and more particularly to a wireless transmission apparatus for transmitting a RF signal in a power allocation corresponding to specific transmission standard.

2. Description of the Prior Art

The wireless terminal apparatus in the prior art, e.g. the GSM mobile station, transmits a RF signal in a specific power allocation corresponding to the requirement of wireless transmission standard, e.g. the GSM specifications, by a wireless transmission apparatus. Like the GSM, the power allocation gradually ramp the power strength from zero to the needed level, and then the power strength is held steadily. Subsequently, the power allocation gradually ramps the power strength down to 0. The method to allocate the power strength transmitted is determined by a plurality of predetermined power ramp profiles. Besides, the power allocation may change the level of power and the allocation of the power strength transmitted according to transmission conditions, for example, the ambient temperature, the voltage of a battery, and the transmission frequency.

There are two methods to transmit the power of the wireless transmission apparatus in the prior art. One is according to different transmission conditions, to store all power ramp profiles in memories of the wireless transmission apparatus in advance. However, this method needs a lot of memories and is unbeneficial to the wireless terminal apparatus.

The other method, such as U.S. Pat. No. 5,159,283, is to store only a plurality of standard power ramp profiles in memories in advance. In practical application, choose a proper power ramp profile. A processor of the wireless transmission apparatus calculates and amplifies to an appropriate power allocation, and then transmits it. The processor may be a microprocessor, a digital signal processor, etc. This method uses fewer memories but increases a lot of load to the processor and cause that the wireless transmission apparatus must adopt a higher calculation speed and more expensive processors.

Other related arts further include U.S. Pat. No. 5,697,073, Europe patent No. EP 0407135A2, etc. The disclosed techniques within these patents all have the above disadvantages.

Thus, the primary objective of the present invention is to provide a wireless transmission apparatus for solving the above problems of occupying memories and the load of processors.

SUMMARY OF THE INVENTION

It is therefore a primary object of the present invention to provide a wireless transmission apparatus, and more particularly to a power transmission method without occupying too many memories and increasing the load of processors.

The present invention is a wireless transmission apparatus for transmitting a RF signal in a selected power allocation. The wireless transmission apparatus comprises a memory, a processor, and a power data converting module. The memory is used to store a plurality of predetermined original power data profiles, and each original power data profile comprises a plurality of predetermined first original power ramp data. The processor is used to control the data flow. The power data converting module converts the first original power ramp data of the original power data profile to a corresponding data of the transmission power data profile. In one aspect of the inventing, the power data converting module comprises an interpolation adjusting unit independent of the processor. The interpolation adjusting unit adjusts and increases the plurality of first predetermined original power ramp data of each original power data profile to a plurality of second transmission power ramp data with a predetermined interpolating method. The plurality of second transmission power ramp data are more than and comprising the plurality of first original power ramp data. The power amplifier of the wireless transmission apparatus transmits the received RF signal according to the power allocation defined by the plurality of second transmission power ramp data.

The invention further provides a method for transmitting a RF signal in a selected power allocation. The method begins with storing a plurality of predetermined original power data profiles. Each original power data profile comprises a plurality of predetermined first original power ramp data corresponding to a power allocation for transmitting the RF signal. One original power data profile is selected from the plurality of predetermined original power data profiles by a processor. The selected original power data profile is converted to a corresponding transmission power data by a power converting module.

To compare with the wireless transmission apparatus in the prior art, the wireless transmission apparatus of the present invention calculates data points by the interpolation adjusting unit to effectively reduce the number of original power ramp data profiles stored in the memory and the space occupied by the memory within the wireless terminal apparatus. Besides, the interpolation adjusting unit of the present invention is independent of the processor, which can reduce the load and the power wasted by the processor effectively to improve the life-span of batteries of the wireless terminal apparatus.

These and other objectives of the present invention will no doubt become obvious to those of ordinary skill in the art after reading the following detail description of the preferred embodiment, which is illustrated in the various figures and drawings.

BRIEF DESCRIPTION OF THE APPENDED DRAWINGS

DETAILED DESCRIPTION OF THE INVENTION

The present invention provides a wireless transmission apparatus for transmitting a RF signal based in a selected power allocation of a specific power allocation by an antenna. The wireless transmission apparatus comprises a processor, a memory, and a power data converting module. The processor is used to control the data flow. The memory is used to store a plurality of predetermined original power data profiles. The power data converting module, coupled to the processor, is used to converting the data of the original power data profile to a corresponding one of the transmission power data profile. The power data converting module comprises a ratio adjusting unit for adjusting the value of data of the original power data profile or the transmission power data profile in equal ratio. Therefore, the present invention can decrease the amount of original power data profiles stored in the memory and reduce the load of the processor.

Figure 1:
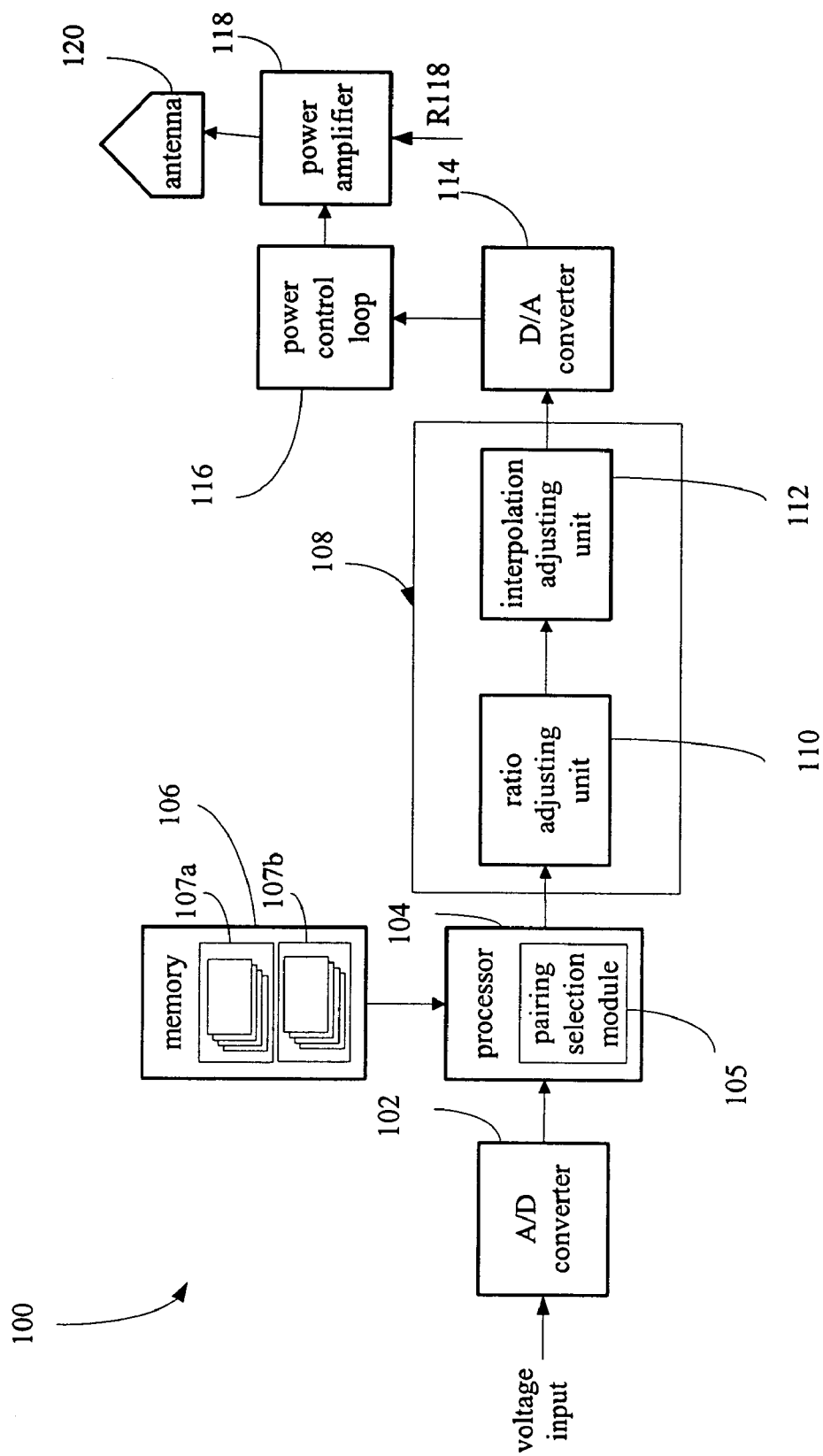
FIG. 1 is a block diagram of the wireless transmission apparatus of the preferred embodiment according to the present invention.

Please refer to FIG. 1. FIG. 1 is a block diagram of the wireless transmission apparatus 100 of the preferred embodiment according to the present invention. The wireless transmission apparatus 100 comprises an A/D converter 102, a processor 104, a memory 106, and a power data converting module 108. The processor 104 is used to control the data flow. The memory 106 is used to store a plurality of predetermined original power data profiles. The A/D converter 102 is used to convert an analog signal, such as the voltage of a battery or the ambient temperature, to a corresponding digital data for the reference of the processor 104 to calculate the proper power value and select the proper original power data profile from the memory 106. The power data converting module 108, coupled to the processor, is used to convert the data of the original power data profile to a corresponding data of the transmission power data profile. The memory 106 may be a ROM, RAM, or any registers.

Each original power data profile comprises a plurality of first predetermined original power ramp data corresponding to a power allocation for transmitting the RF signal. Because the present embodiment is applied to the GSM system, the power allocation for the RF signal transmitted comprises the following steps: gradually ramp-up first, steady secondly, and then gradually ramp-down. According to the above steps, a power-gradually-ramping-up period, a power steady period, and a power-gradually-ramping-down period are defined. The memory 106 comprises a power ramp-up table 107a and a power ramp-down table 107b for storing the plurality of original power ramp data profiles needed during the power-gradually-ramping-up period and the power-gradually-ramping-down period respectively. The power value of the power steady period is the best power value of the transmitted RF signal in the time slot.

The processor 104 further comprises a pairing selection module 105 for selecting a set of original power ramp data from the power ramp-up table 107a and the power ramp-down table 107b stored in the memory 106 respectively to pair for the original power ramp data needed by the original power data profile.

The power data converting module 108 comprises a ratio adjusting unit 110 and an interpolation adjusting unit 112. The interpolation adjusting unit 112 adjusts and increases the plurality of first predetermined original power ramp data within each original power data profile to a plurality of second transmission power ramp data in a predetermined interpolating method. The amount of second transmission power ramp data is more than the amount of first original power ramp data. In other words, the second transmission power ramp data includes the first transmission power ramp data. The power amplifier 118 receives the plurality of second transmission power ramp data and transmits the received RF signal R118 according to the power allocation defined by the plurality of second transmission power ramp data.

The ratio adjusting unit 110 of the power data converting module 108 is used to adjust the value of data of the original power data profile or the transmission power data profile in a equal ratio. In the present embodiment, the ratio adjusting unit 110 is a multiplier for multiplying the data of the original power data profile or the transmission power data profile by a predetermined ratio parameter to adjust the value of data. The ratio adjusting unit 110, coupled to the processor 104, multiplies the plurality of data by the ratio parameter without occupying the processor 104 to process the RF signal.

Otherwise, processing the multiplication by the processor 104 directly will consume a large amount of the computing capability of the processor 104. The wireless transmission apparatus 100 must calculate the wireless transmission power ramp frequently and largely. Therefore, the high speed and expensive processor 104 is necessary. One important feature of the present embodiment is that the ratio adjusting unit 110 is independent of the processor 104 to greatly reduce the load of the processor 104, and a more economical processor 104 may be applied to the wireless transmission apparatus 100 to reduce the material cost.

The wireless transmission apparatus 100 further comprises a D/A converter 114, a power control loop 116, a power amplifier 118, and an antenna 120. The D/A converter 114 is used to convert the digital signal of the second transmission power ramp data to a corresponding analog signal. The power control loop 116 controls the power amplifier 118 to amplify the power of the RF signal R118 according to the analog data of the second transmission power data profile converted by the D/A converter 114. The RF signal R118 is amplified by the power amplifier 118 and transmitted by the antenna 120.

The following description will illustrate that the wireless transmission apparatus 100 transmits a RF signal corresponding to a specific power allocation by the antenna 120. First, the A/D converter 102 converts a signal representing the voltage or the ambient temperature to a corresponding digital data. The processor 104 selects a set of original power ramp data from the power ramp-up table 107a and the power ramp-down table 107b respectively by the pairing selection module 105 to pair for the original power data profile. The original power data profile comprises a plurality of first original power ramp data.

When the data of the original power data profile enter the power data converting module 108, the ratio adjusting unit 110 adjusts the value of the first original power ramp data of the original power data profile in a ratio of equality. Afterward, the interpolation adjusting unit 112 receives the adjusted first original power ramp data and adjusts the first original power ramp data to a plurality of second transmission power ramp data with a predetermined interpolating method. Then, the D/A converter 114 converts the digital signal of the second transmission power ramp data to a corresponding analog signal. The second transmission power ramp data are inputted to the power amplifier 118 after the analog signal passes the power control loop 116. The power amplifier 118 amplifies and adjusts the RF signal R118 according to the received second transmission power ramp data. Finally, the antenna 120 transmits the RF signal corresponding to the wireless transmission standard.

Figure 2:
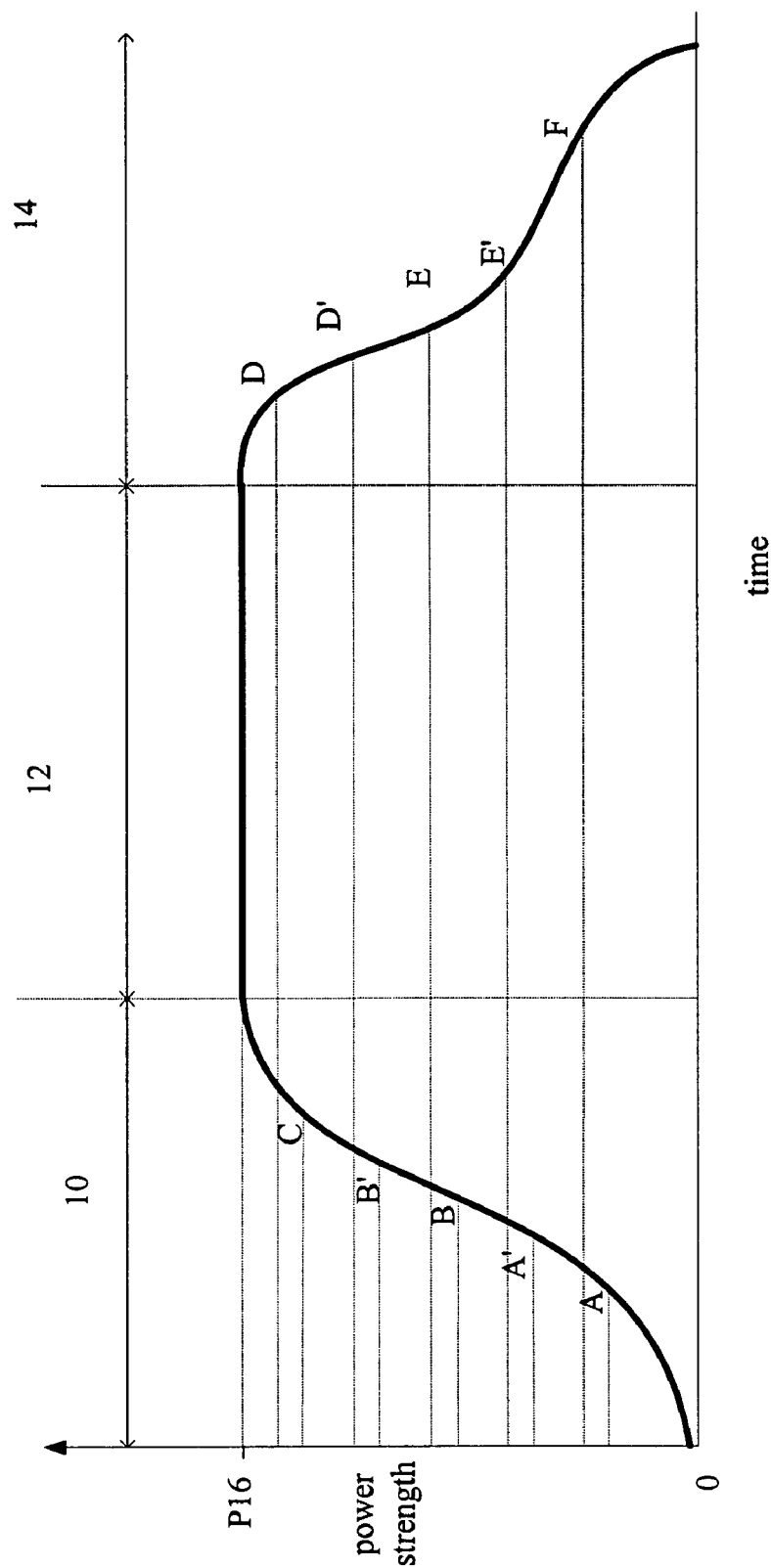
FIG. 2 is a power allocation diagram of transmitting a RF signal by the wireless transmission apparatus shown in FIG. 1.

Please refer to FIG. 2. FIG. 2 is a power allocation diagram of transmitting a RF signal by the wireless transmission apparatus 100 shown in FIG. 1. In the present embodiment, the power allocation diagram corresponds to the standard of the GSM. The vertical coordinate in FIG. 2 is the transmission power strength and the horizontal coordinate in FIG. 2 is the time. According to the above illustration, the power allocation of the present invention is gradually ramp-up first, steady secondly, and then gradually ramp-down. According to the above steps, a power-gradually-ramping-up period 10, a power steady period 12, and a power-gradually-ramping-down period 14 are defined. During the power-gradually-ramping-up period 10, the wireless transmission apparatus 100 gradually ramps up the power of the RF signal transmitted from 0 to a target power P16. During the power steady period 12, the wireless transmission apparatus 100 holds the power of the RF signal transmitted at the target power P16. During the power-gradually-ramping-down period 14, the power of the RF signal is gradually ramped down from the target power P16 to 0 after the RF signal has been transmitted. The power degree and the transmission strength of the power allocation, according to the different conditions, e.g. the voltage of a battery, the transmission frequency, etc., may be different, but the power allocation must fit the transmission standard requirement of the GSM in this present invention.

According to the above illustration, the memory 106 comprises a power ramp-up table 107a and a power ramp-down table 107b. The power ramp-up table 107a is stored in a plurality of original power ramp data profiles needed during the power-gradually-ramping-up period 10. The power ramp-down table 107b is stored in a plurality of original power ramp data profiles needed during the power-gradually-ramping-down period 14. In FIG. 2, the data points A, B, and C represent one of the plurality of original power ramp data profiles stored in the power ramp-up table 107a of the original power data profile in the memory 106. The data points E, F, and G represent one of the plurality of original power ramp data profiles stored in the power ramp-down table 107b of the original power ramp data profile. The data points A, B, C, D, E, and F represent the plurality of first original power ramp data after selected and paired by the pairing selection module 105 of the processor.

After the plurality of first original power ramp data are processed by the interpolation adjusting unit 112 with a predetermined interpolation method, the data points A', B', D', and E' are obtained from the data points A, B, C, D, E, and F. The data points A, B, C, D, E, F, A', B', D', and E' represent the plurality of second transmission power ramp data. Therefore, the plurality of second transmission power ramp data (the data points A, B, C, D, E, F, A', B', D', and E') are more than and comprising the plurality of first original power ramp data (the data points A, B, C, D, E, and F). The power amplifier 118 of the wireless transmission apparatus 110, according to the plurality of second transmission power ramp data, amplifies and adjusts the RF signal R118, and then transmits the RF signal R118.

The interpolation adjusting unit 112 is independent of the processor 114 and generates data points by interpolating calculation. The number of the plurality of first original power ramp data stored in the memory 106 can be reduced effectively. The load and the power wasted by the processor 104 also can be reduced, thus extend the life span of the battery of the wireless terminal apparatus. In the present embodiment, 16 first original power ramp data are stored in one of original power data profile in the memory 106. After processed by the interpolation adjusting unit 112, 32 second transmission power ramp data will be generated.

In the present embodiment, the predetermined interpolation method, which the interpolation adjusting unit 112 uses, is a linear interpolation method to sum up and average any two neighbor data of the original power data profile to generate the corresponding data of the transmission power data profile. For example, as shown in FIG. 2, the average power value of the data point A and the data point B is the power value of the data point A'.

Besides, the predetermined interpolation method, which the interpolation adjusting unit 112 uses, may also be a weighted interpolation method. Any two neighbor data of the original power data profile are multiplied by the corresponding weighted value respectively and then sum up the results to generate the corresponding interpolation data of the transmission power data profile. In this embodiment, the wireless transmission apparatus further comprises a weighted value table for providing the weighted value when the interpolation adjusting unit processes the weighted interpolation method. For example, as shown in FIG. 2, the power values of the data point A and the data point B are multiplied by the weighted value indicated in the weighted value table respectively and then sum up the results to generate the power value of the data point A'.

The function of the digital data exchange of the processor 104 can be processed by the memory 106. The processor 104 controls each component, e.g. the memory 106, the ratio adjusting unit 110 and the interpolation adjusting unit 112, etc., by a bus.

Figure 3:
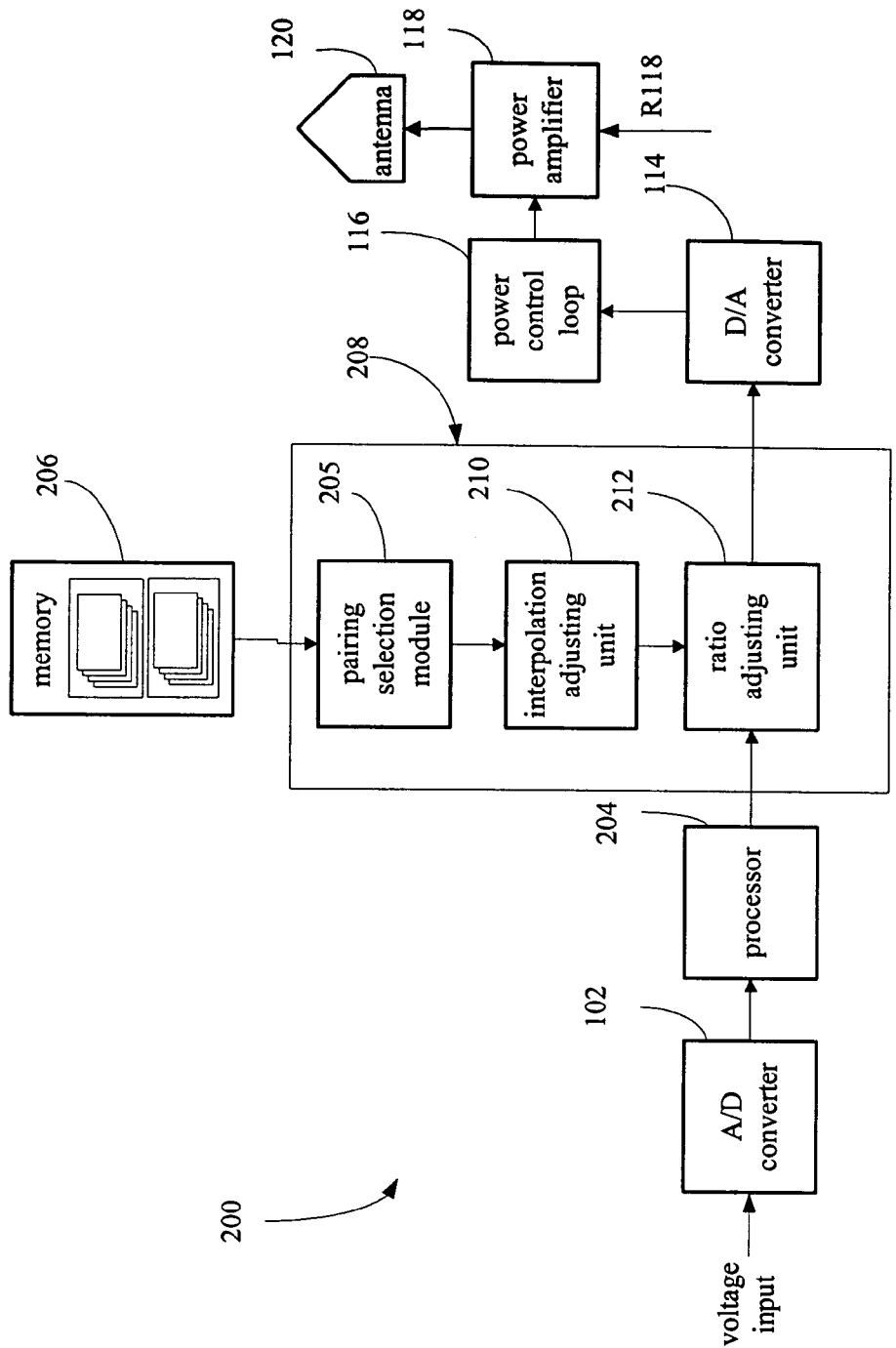
FIG. 3 is a block diagram of the wireless transmission apparatus of another preferred embodiment according to the present invention.

Please refer to FIG. 3. FIG. 3 is a block diagram of the wireless transmission apparatus 200 of another preferred embodiment according to the present invention. The main difference between the wireless transmission apparatus 200 in FIG. 3 and the wireless transmission apparatus 100 in FIG. 1 is the method of processing the signal between the processor, the memory, and the power data converting module. In the wireless transmission apparatus 200, one of original power ramp data is selected from the memory 206 by the pairing selection module 205 of the power data converting module 208. When the original power data profile enters the power data converting module 208, the interpolation adjusting unit 210 adjusts the original power ramp data to the plurality of second transmission power ramp data with a predetermined interpolating method. Afterward, the ratio adjusting unit 212 receives the plurality of second transmission power ramp data and adjusts the value in a ratio of equality.

Figure 4:
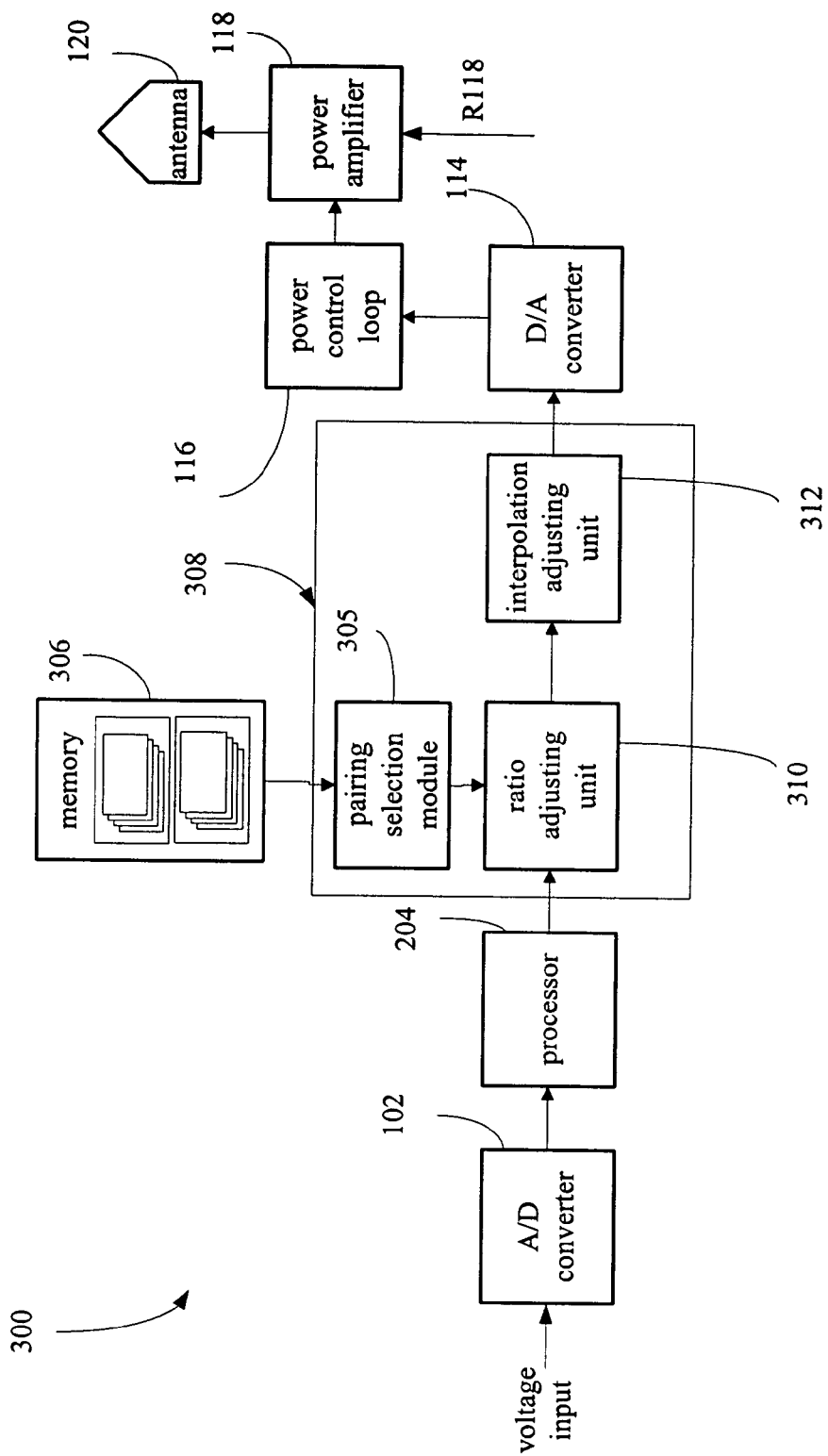
FIG. 4 is a block diagram of the wireless transmission apparatus of another preferred embodiment according to the present invention.

Please refer to FIG. 4. FIG. 4 is a block diagram of the wireless transmission apparatus 300 of another preferred embodiment according to the present invention. The main difference between the wireless transmission apparatus 300 in FIG. 4 and the wireless transmission apparatus 200 in FIG. 3 is the power data converting module. In the wireless transmission apparatus 300, one of original power ramp data is selected from the memory 306 by the pairing selection module 305 of the power data converting module 308. The value of the original power data profile is adjusted in an equal ratio by the ratio adjusting unit 310, and then adjusted to the plurality of second transmission power ramp data with a predetermined interpolating method by the interpolation adjusting unit 312.

To compare with the wireless transmission apparatus in the prior art, the wireless transmission apparatus 100, 200, and 300 of the present invention calculates data points by the interpolation adjusting unit to effectively reduce the number of original power ramp data profiles stored in the memory and the space in the wireless terminal apparatus occupied by the memory. Besides, the ratio adjusting unit and the interpolation adjusting unit of the present invention are both independent of the processor, which can reduce the load and the power wasted by the processor effectively to extend the life span of the battery of the wireless transmission apparatus.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A wireless transmission apparatus for transmitting a RF signal in a selected power allocation, the wireless transmission apparatus comprising:
   a processor;
   a memory for storing a plurality of predetermined original power data profiles, each original power data profile comprising a plurality of predetermined first original power ramp data corresponding to a power allocation for transmitting the RF signal; and
   a power data converting module, independent of the processor, for converting the data of original power data profile to a corresponding data of transmission power data profile;
   wherein the power data converting module comprises an interpolation adjusting unit which adjusts and increases the plurality of predetermined first original power ramp data within each original power data profile to a plurality of second transmission power ramp data with a predetermined interpolating method for transmitting the RF signal by the wireless transmission apparatus according to the power allocation defined by the plurality of second transmission power ramp data, and the plurality of second transmission power ramp data are more than and comprise the plurality of first original power ramp data.

2. The wireless transmission apparatus of claim 1, wherein the power data converting module further comprises a ratio adjusting unit for adjusting the value of data of the original power data profile or the transmission power data profile in an equal ratio.

3. The wireless transmission apparatus of claim 2, wherein the ratio adjusting unit is a multiplier for multiplying the data of the original power data profile or the transmission power data profile by a predetermined ratio parameter to adjust the value of data.

4. The wireless transmission apparatus of claim 3, wherein the multiplier multiplies the plurality of data with the ratio parameter without occupying the processor to process the RF signal.

5. The wireless transmission apparatus of claim 1, wherein the predetermined interpolation method, which the interpolation adjusting unit uses, is a linear interpolation method for summing up and averaging any two neighbor data of the original power data profile to generate the corresponding data of the transmission power data profile.

6. The wireless transmission apparatus of claim 1, wherein the predetermined interpolation method, which the interpolation adjusting unit uses, is a weighted interpolation method for multiplying any two neighbor data of the original power data profile with corresponding weighted value and summing the data to generate the corresponding data of the transmission power data profile.

7. The wireless transmission apparatus of claim 6, wherein the wireless transmission apparatus further comprises a weighted value table for providing the weighted value when the interpolation adjusting unit processes the weighted interpolation method.

8. The wireless transmission apparatus of claim 1, wherein the power allocation processes the power ramp for the RF signal transmitted by gradually ramp-up first, steady secondly, and then gradually ramp-down, and defines a power gradually ramp-up period, a power steady period, and a power gradually ramp-down period.

9. The wireless transmission apparatus of claim 1, wherein the memory may be a ROM, RAM, or any registers.

10. The wireless transmission apparatus of claim 9, wherein the memory comprises a power ramp-up table for storing the plurality of original power ramp data profiles needed during the power gradually ramp-up period.

11. The wireless transmission apparatus of claim 10, wherein the memory comprises a power ramp-down table for storing the plurality of original power ramp data profiles needed during the power gradually ramp-down period.

12. The wireless transmission apparatus of claim 11, wherein the processor comprises a pairing selection module for selecting a set of original power ramp data from the power ramp-up table and the power ramp-down table respectively to pair for the original power ramp data needed by the original power data profile.

13. The wireless transmission apparatus of claim 12, wherein the power data converting module comprises a pairing selection module for selecting a set of original power ramp data from the power ramp-up table and the power ramp-down table respectively to pair for the original power ramp data needed by the original power data profile.

14. The wireless transmission apparatus of claim 1, wherein the wireless transmission apparatus further comprises a D/A converter for converting the digital data of the transmission power data profile generated by the power data converting module to a corresponding analog data.

15. The wireless transmission apparatus of claim 14, wherein the wireless transmission apparatus further comprises a power amplifier and a power control loop which controls the power amplifier to amplify the power of the RF signal according to the analog data of the transmission power data profile converted by the D/A converter.

16. The wireless transmission apparatus of claim 15, wherein the wireless transmission apparatus further comprises an antenna for transmitting the RF signal amplified by the power amplifier.

17. The wireless transmission apparatus of claim 1, wherein the processor may be a microprocessor or a digital signal processor.

18. A wireless transmission apparatus for transmitting a RF signal in a selected power allocation, the wireless transmission apparatus comprising:
   a processor;
   a memory for storing a plurality of predetermined original power data profiles, each original power data profile comprising a plurality of predetermined first original power ramp data corresponding to a power allocation for transmitting the RF signal; and
   a power data converting module, independent of the processor, for converting the data of original power data profile to a corresponding data of transmission power data profile;
   wherein the power data converting module further comprises a ratio adjusting unit for adjusting the value of data of the original power data profile or the transmission power data profile in an equal ratio of.

19. The wireless transmission apparatus of claim 18, wherein the ratio adjusting unit is a multiplier for multiplying the data of the original power data profile or the transmission power data profile by a predetermined ratio parameter to adjust the value of data.

20. The wireless transmission apparatus of claim 18, wherein the power allocation processes the power ramp for the RF signal about to be transmitted by gradually ramp-up first, steady secondly, and then gradually ramp-down, and defines a power gradually ramp-up period, a power steady period, and a power gradually ramp-down period.

21. The wireless transmission apparatus of claim 20, wherein the memory comprises a power ramp-up table for storing the plurality of original power ramp data profiles needed during the power gradually ramp-up period.

22. The wireless transmission apparatus of claim 21, wherein the memory comprises a power ramp-down table for storing the plurality of original power ramp data profiles needed during the power gradually ramp-down period.

23. The wireless transmission apparatus of claim 22, wherein the processor comprises a pairing selection module for selecting a set of original power ramp data from the power ramp-up table and the power ramp-down table respectively to pair for the original power ramp data needed by the original power data profile.

24. The wireless transmission apparatus of claim 18, wherein the processor may be a microprocessor or a digital signal processor.

25. A wireless transmission apparatus for transmitting a RF signal in a selected power allocation, the wireless transmission apparatus comprising:
   a memory storing a plurality of predetermined original power data profiles, each original power data profile comprising a plurality of predetermined first original power ramp data and corresponding to a power allocation for transmitting the RF signal;
   a processor generating a control signal; and
   a power data converting module receiving the control signal, selecting one original power data profile from the plurality of predetermined original power data profiles according to the control signal, and converting the selected original power data profile to a transmission power data profile.

26. The wireless transmission apparatus as claimed in claim 25 further comprising a interpolation adjusting unit, wherein the converting selected original power data profile is that the interpolation adjusting unit interpolates the plurality of predetermined first original power ramp data to a plurality of second transmission power ramp data with a predetermined interpolating method,
   wherein the plurality of second transmission power ramp data form the transmission power data profile, and the amount of the plurality of second transmission power ramp data is more than the amount of the plurality of first original power ramp data,
   wherein the RF signal is transmitted according to the power allocation defined by the plurality of second transmission power ramp data.

27. The wireless transmission apparatus as claimed in claim 26, wherein the predetermined interpolation method is a linear interpolation method for summing up and averaging any two neighboring data of the original power data profile to generate the corresponding data of the transmission power data profile.

28. The wireless transmission apparatus as claimed in claim 27, further comprising an antenna for transmitting the RF signal amplified by the power amplifier.

29. The wireless transmission apparatus as claimed in claim 26, wherein the predetermined interpolation method is a weighted interpolation method for multiplying any two neighbor data of the original power data profile with corresponding weighted values and summing the weighted data to generate the corresponding data of the transmission power data profile.

30. The wireless transmission apparatus as claimed in claim 29 further comprising a weighted value table for providing the weighted values when the interpolation adjusting unit processes the weighted interpolation method.

31. The wireless transmission apparatus as claimed in claim 25, wherein the power data converting module further comprises a ratio adjusting unit adjusting the values of the plurality of first original power ramp data in the original power data profile to form the transmission power data profile.

32. The wireless transmission apparatus as claimed in claim 31, wherein the ratio adjusting unit is a multiplier multiplying the values of the plurality of first original power ramp data in the original power data profile by a predetermined ratio parameter.

33. The wireless transmission apparatus as claimed in claim 32, further comprising a power amplifier and a power control loop which controls the power amplifier to amplify the power of the RF signal according to the analog data of the transmission power data profile converted by the D/A converter.

34. The wireless transmission apparatus as claimed in claim 31, wherein the processor may be a microprocessor or a digital signal processor.

35. The wireless transmission apparatus as claimed in claim 25, wherein according to the power allocation, the transmission power of the RF signal will gradually ramps-up first, steadies secondly, and then gradually ramps-down, and respectively constitutes a power-gradually-ramping-up period, a power-steadying period, and a power-gradually-ramping-down period.

36. The wireless transmission apparatus as claimed in claim 35, wherein the memory comprises a power ramp-up table for storing a plurality of original power ramp-up data profiles needed during the power-gradually-ramping-up period.

37. The wireless transmission apparatus as claimed in claim 36, wherein the memory comprises a power ramp-down table for storing a plurality of original power ramp-down data profiles needed during the power-gradually-ramping-down period.

38. The wireless transmission apparatus as claimed in claim 25, wherein the memory may be a read-only-memory (ROM), random-access-memory (RAM), or any registers.

39. The wireless transmission apparatus as claimed in claim 25, wherein the processor comprises a pairing selection module for selecting one of the original power ramp-up data profiles from the power ramp-up table and one of the original power ramp-down data profiles from the power ramp-down table respectively for pairing so as to form a required original power data profile.

40. The wireless transmission apparatus as claimed in claim 39, wherein the power data converting module further comprises a pairing selection module for selecting one of the original power ramp-up data profiles from the power ramp-up table and one of the original power ramp-down data profiles from the power ramp-down table respectively for pairing so as to form a required original power data profile.

41. The wireless transmission apparatus as claimed in claim 25, wherein the wireless transmission apparatus further comprises a D/A converter for converting the digital data of the transmission power data profile generated by the power data converting module to corresponding analog data.

42. A method for transmitting a RF signal in a selected power allocation, comprising:
   storing a plurality of predetermined original power data profiles, wherein each original power data profile comprises a plurality of predetermined first original power ramp data and is corresponding to a power allocation for transmitting the RF signal;

generating a control signal;

selecting one original power data profile from the plurality of predetermined original power data profiles according to the control signal; and converting the selected original power data profile to a transmission power data profile.

43. The method as claimed in claim 42, wherein the step of converting is adjusting the values of the plurality of the first original power ramp data in the original power data profile to form the transmission power data profile.

44. The method as claimed in claim 43, wherein the step of converting is multiplying the values of the plurality of first original power ramp data in the original power data profile by a predetermined ratio parameter.

45. The method as claimed in claim 43, wherein the step of converting is interpolating the plurality of predetermined first original power ramp data to a plurality of second transmission power ramp data with a predetermined interpolating method, wherein the plurality of second transmission power ramp data form the transmission power data profile, and the amount of the plurality of second transmission power ramp data is more than the amount of the plurality of first original power ramp data, wherein the RF signal is transmitted according to the power allocation defined by the plurality of second transmission power ramp data.

46. The method as claimed in claim 43, wherein according to the power allocation, the transmission power of the RF signal gradually ramps-up first, steadies secondly, and then gradually ramps-down, and respectively constitutes a power-gradually-ramping-up period, a power-steadying-period, and a power gradually-ramping-down period.

47. The method as claimed in claim 42, wherein the predetermined interpolation method is a linear interpolation method for summing up and averaging any two neighboring data of the original power data profile to generate the corresponding data of the transmission power data profile.

48. The method as claimed in claim 47, wherein the predetermined interpolation method is a weighted interpolation method for multiplying any two neighbor data of the original power data profile with corresponding weighted values and summing the weighted data to generate the corresponding data of the transmission power data profile.

49. The method as claimed in claim 46 further comprising a weighted value table for providing the weighted values when processing the weighted interpolation method.

50. The method as claimed in claim 42 further comprising providing a power ramp-up table for storing a plurality of original power ramp-up data profiles needed during the power-gradually-ramping-up period.

51. The method as claimed in claim 50 further comprising providing a power ramp-down table for storing the plurality of original power ramp-down data profiles needed during the power gradually ramp-down period.

52. The method as claimed in claim 50 further comprising selecting one of the original power ramp-up data profiles from the power ramp-up table and one of original power ramp-down profiles from the power ramp-down table respectively for pairing so as to form a required original power data profile.

* * * * *